US012568712B2

(12) United States Patent
Zou et al.

(10) Patent No.: US 12,568,712 B2
(45) Date of Patent: Mar. 3, 2026

(54) SOLAR CELL AND MANUFACTURING METHOD THEREOF, PHOTOVOLTAIC MODULE AND PHOTOVOLTAIC SYSTEM

(71) Applicant: TRINA SOLAR CO., LTD., Changzhou (CN)

(72) Inventors: Yang Zou, Changzhou (CN); Chengfa Liu, Changzhou (CN); Hong Chen, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/790,628

(22) Filed: Jul. 31, 2024

(65) Prior Publication Data

US 2024/0395954 A1     Nov. 28, 2024

(30) Foreign Application Priority Data

Nov. 15, 2023     (CN) .......................... 202311518068.4

(51) Int. Cl.
*H10F 77/20*          (2025.01)
*H10F 77/14*          (2025.01)

(52) U.S. Cl.
CPC .......... *H10F 77/211* (2025.01); *H10F 77/14* (2025.01)

(58) Field of Classification Search
None
See application file for complete search history.

(56) References Cited

U.S. PATENT DOCUMENTS

| | | | |
|---|---|---|---|
| 2016/0197204 A1 | 7/2016 | Lee et al. | |
| 2017/0301805 A1 | 10/2017 | Yamarin et al. | |
| 2023/0079799 A1* | 3/2023 | Qu ........................ | H01L 31/049 |
| 2023/0352602 A1 | 11/2023 | Zhang et al. | |

FOREIGN PATENT DOCUMENTS

| | | |
|---|---|---|
| AU | 2023 222 978 A1 | 9/2023 |
| AU | 2023 233 208 A1 | 10/2023 |
| CN | 102544215 A | 7/2012 |
| CN | 105552150 A | 5/2016 |
| CN | 109888058 A | 6/2019 |
| CN | 208970517 U | 6/2019 |
| CN | 113675289 A | 11/2021 |
| CN | 114639744 A | 6/2022 |

(Continued)

OTHER PUBLICATIONS

Machine translation of JP H04356972 A (Year: 1992).*

(Continued)

*Primary Examiner* — Tamir Ayad
(74) *Attorney, Agent, or Firm* — MARSHALL, GERSTEIN & BORUN LLP

(57)          ABSTRACT

A solar cell and a manufacturing method thereof, a photovoltaic module, and a photovoltaic system. A doped layer of the solar cell includes a lightly doped region and a heavily doped region, the heavily doped region includes a body region, connecting regions, and edge regions, and an electrode includes an electrode body, connecting electrodes and edge electrodes. The body region substantially corresponds to the electrode body, and the connecting regions and the edge regions can provide spaces exceeding the spaces corresponding to the connecting electrodes and the edge electrodes.

15 Claims, 6 Drawing Sheets

(56)     References Cited

FOREIGN PATENT DOCUMENTS

| CN | 115000213 A | 9/2022 | |
|----|-------------|--------|---|
| CN | 115312387 A | 11/2022 | |
| JP | 04356972 A * | 12/1992 | ............ H01L 31/04 |
| JP | H0548124 B2 | 7/1993 | |
| JP | 2008-205398 A | 9/2008 | |
| JP | 2011-524639 A | 9/2011 | |
| JP | 2013-89962 A | 5/2013 | |
| JP | 2014-229826 A | 12/2014 | |
| JP | 2015-109364 A | 6/2015 | |
| JP | 2015-130527 A | 7/2015 | |
| JP | 2017-45818 A | 3/2017 | |

OTHER PUBLICATIONS

Decision of Grant, Chinese Patent Application No. 202311518068.4, dated Jan. 17, 2024.

First Chinese Office Action, Chinese Patent Application No. 202311518068.4, dated Dec. 18, 2023.

Second Chinese Office Action, Chinese Patent Application No. 202311518068.4, dated Jan. 9, 2024.

Notification of Reasons for Refusal, Japanese Patent Application No. 2024-092429, (Oct. 21, 2024).

Office Action, Australian patent application No. 2024204864, dated Sep. 9, 2024.

Office Action, Japanese patent application No. 2024-092429, dated Oct. 21, 2024.

European Search Report, European Patent Application No. 24182032.3, Jan. 31, 2025.

* cited by examiner

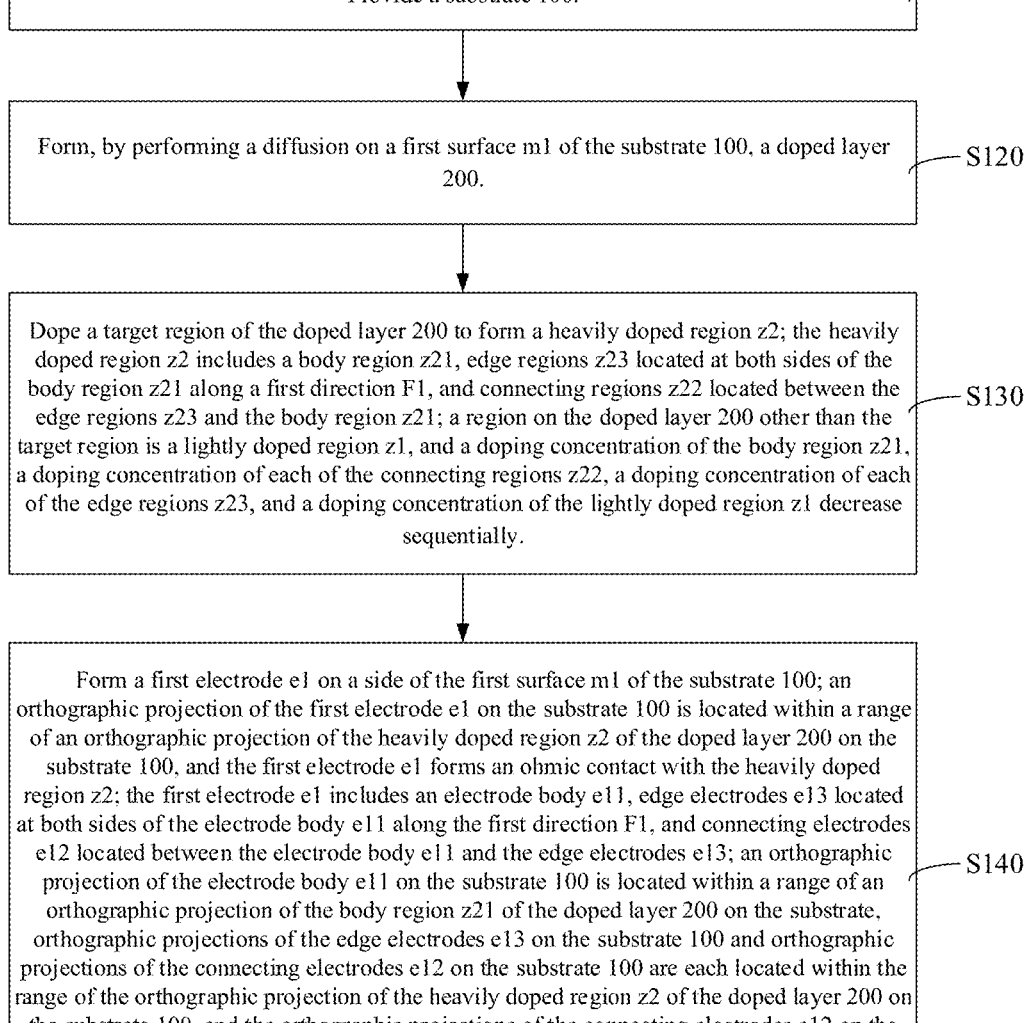

Provide a substrate 100.    ─S110

Form, by performing a diffusion on a first surface m1 of the substrate 100, a doped layer 200.    ─S120

Dope a target region of the doped layer 200 to form a heavily doped region z2; the heavily doped region z2 includes a body region z21, edge regions z23 located at both sides of the body region z21 along a first direction F1, and connecting regions z22 located between the edge regions z23 and the body region z21; a region on the doped layer 200 other than the target region is a lightly doped region z1, and a doping concentration of the body region z21, a doping concentration of each of the connecting regions z22, a doping concentration of each of the edge regions z23, and a doping concentration of the lightly doped region z1 decrease sequentially.    ─S130

Form a first electrode e1 on a side of the first surface m1 of the substrate 100; an orthographic projection of the first electrode e1 on the substrate 100 is located within a range of an orthographic projection of the heavily doped region z2 of the doped layer 200 on the substrate 100, and the first electrode e1 forms an ohmic contact with the heavily doped region z2; the first electrode e1 includes an electrode body e11, edge electrodes e13 located at both sides of the electrode body e11 along the first direction F1, and connecting electrodes e12 located between the electrode body e11 and the edge electrodes e13; an orthographic projection of the electrode body e11 on the substrate 100 is located within a range of an orthographic projection of the body region z21 of the doped layer 200 on the substrate, orthographic projections of the edge electrodes e13 on the substrate 100 and orthographic projections of the connecting electrodes e12 on the substrate 100 are each located within the range of the orthographic projection of the heavily doped region z2 of the doped layer 200 on the substrate 100, and the orthographic projections of the connecting electrodes e12 on the substrate 100 are not located within a range of orthographic projections of the edge regions z23 of the doped layer 200 on the substrate 100.    ─S140

FIG. 7

SOLAR CELL AND MANUFACTURING METHOD THEREOF, PHOTOVOLTAIC MODULE AND PHOTOVOLTAIC SYSTEM

CROSS-REFERENCE TO RELATED APPLICATIONS

This application claims priority to Chinese patent application No. 202311518068.4, filed on Nov. 15, 2023, the content of which is hereby incorporated by reference in its entirety.

TECHNICAL FIELD

The present disclosure relates to the technical field of solar cells, and in particular, to a solar cell and a manufacturing method thereof, a photovoltaic module and a photovoltaic system.

BACKGROUND

The selective emitter (SE) laser doping technology is a technology that performs diffusion in a contact region on a surface of a substrate to form a heavily doped region and lightly dopes in a non-contact region. For a selective emission electrode, a contact resistance of the contact region can be reduced and a series resistance of a solar cell can be reduced, meanwhile, carrier recombination in the lightly doped region can be effectively reduced, and passivation on the surface of the substrate is improved.

However, in the above process, there is a situation where a part of the electrode is in contact with the lightly doped region, thereby affecting the passivation on the surface of the substrate.

SUMMARY

Based on this, it is necessary to provide a solar cell and a manufacturing method thereof, a photovoltaic module and a photovoltaic system to ameliorate the situation where a part of the electrode is in contact with the lightly doped region, thereby improving the passivation on the surface of the substrate.

According to an aspect of the present disclosure, an embodiment of the present disclosure provides a solar cell, including:

a substrate having a first surface;

a doped layer disposed on the first surface of the substrate; the doped layer including a lightly doped region and a heavily doped region, the heavily doped region including a body region, edge regions located at both sides of the body region along a first direction, and connecting regions located between the edge regions and the body region; and a first electrode disposed on a side of the first surface of the substrate; an orthographic projection of the first electrode on the substrate being located within a range of an orthographic projection of the heavily doped region of the doped layer on the substrate, and the first electrode forming an ohmic contact with the heavily doped region;

wherein the first electrode includes an electrode body, edge electrodes located at both sides of the electrode body along the first direction, and connecting electrodes located between the electrode body and the edge electrodes;

wherein an orthographic projection of the electrode body on the substrate is located within a range of an orthographic projection of the body region of the doped layer on the substrate, orthographic projections of the edge electrodes on the substrate and orthographic projections of the connecting electrodes on the substrate are each located within the range of the orthographic projection of the heavily doped region of the doped layer on the substrate, and the orthographic projections of the connecting electrodes on the substrate are not located within a range of orthographic projections of the edge regions of the doped layer on the substrate;

wherein a doping concentration of the body region, a doping concentration of each of the connecting regions, a doping concentration of each of the edge regions, and a doping concentration of the lightly doped region decrease sequentially.

In an embodiment, a junction depth of the body region, a junction depth of each of the connecting regions, a junction depth of each of the edge regions, and a junction depth of the lightly doped region decrease sequentially.

In an embodiment, a junction depth of the heavily doped region is in a range of 1.0 μm to 2.6 μm, and the junction depth of the lightly doped region is in a range of 0.6 μm to 1.6 μm.

In an embodiment, a square resistance of the body region, a square resistance of each of the connecting regions, a square resistance of each of the edge regions, and a square resistance of the lightly doped region increase sequentially.

In an embodiment, a square resistance of the heavily doped region is in a range of 40 Ω/□ to 120 Ω/□, and the square resistance of the lightly doped region is in a range of 160 Ω/□ to 300 Ω/□.

In an embodiment, a size of the body region, a size of each of the connecting regions, and a size of each of the edge regions decrease sequentially along the first direction.

In an embodiment, a size of the heavily doped region along the first direction is in a range of 20 μm to 120 μm.

In an embodiment, the substrate includes a P-type substrate, and the doped layer is a phosphorus-doped layer; or the substrate includes an N-type substrate, and the doped layer is a boron-doped layer.

According to another aspect of the present disclosure, an embodiment of the present disclosure provides a manufacturing method of a solar cell, including:

providing a substrate;

forming, by performing a diffusion on a first surface of the substrate, a doped layer;

doping a target region of the doped layer to form a heavily doped region; the heavily doped region including a body region, edge regions located at both sides of the body region along a first direction, and connecting regions located between the edge regions and the body region; a region on the doped layer other than the target region being a lightly doped region, and a doping concentration of the body region, a doping concentration of each of the connecting regions, a doping concentration of each of the edge regions, and a doping concentration of the lightly doped region decreasing sequentially; and forming a first electrode on a side of the first surface of the substrate; an orthographic projection of the first electrode on the substrate being located within a range of an orthographic projection of the heavily doped region of the doped layer on the substrate, and the first electrode forming an ohmic contact with the heavily doped region; the first electrode including an electrode body, edge electrodes located at both sides of the electrode body along the first direction, and connecting electrodes located between the electrode body and the edge electrodes; an orthographic projection of the electrode body on the substrate being located within a range of an orthographic projection of the body region of the doped layer on the substrate, orthographic projections of the edge electrodes on the substrate and orthographic projections of the connecting electrodes on the substrate being each located within the range of the orthographic projection of the heavily doped region of the doped layer on the substrate, and the orthographic projections of the connecting electrodes on the substrate being not located within a range of orthographic projections of the edge regions of the doped layer on the substrate.

In an embodiment, doping the target region of the doped layer to form the heavily doped region includes:

doping, by a laser doping process, the target region to form the heavily doped region.

In an embodiment, the laser doping process is a one-time laser doping process.

In an embodiment, a ratio of a size of a laser spot to a size of the heavily doped region along the first direction is 1.

In an embodiment, the size of the laser spot along the first direction is in a range of 20 μm to 120 μm.

In an embodiment, a laser power is in a range of 20 W to 150 W, a laser irradiation frequency is in a range of 20 kHz to 3000 kHz, and a laser scanning speed is in a range of 10 m/s to 50 m/s.

According to yet another aspect of the present disclosure, an embodiment of the present disclosure provides a photovoltaic module, including the solar cell of any of the above embodiments; or including the solar cell manufactured by the manufacturing method of a solar cell of any of the above embodiments.

According to yet another aspect of the present disclosure, an embodiment of the present disclosure provides a photovoltaic system including the photovoltaic module of any of the above embodiments.

In the above-mentioned solar cell and manufacturing method thereof, photovoltaic module and photovoltaic system, the doped layer of the solar cell includes the lightly doped region and the heavily doped region, the heavily doped region includes the body region, the connecting regions, and the edge regions, and the electrode includes the electrode body, the connecting electrodes and the edge electrodes. The body region substantially corresponds to the electrode body, and the connecting regions and the edge regions can provide spaces more than spaces corresponding to the connecting electrodes and the edge electrodes. Since the doping concentration of the body region, the doping concentration of each of the connecting regions, the doping concentration of each of the edge regions, and the doping concentration of the lightly doped region decrease sequentially, the ohmic contact between a part of the electrode and the lightly doped region can be improved, while reducing carrier recombination and improving the passivation on the surface of the substrate, thereby improving the open-circuit voltage of the solar cell, and improving the fill factor of the solar cell and the conversion efficiency of the solar cell.

Additional aspects and advantages of the embodiments of the present disclosure will be partially given in the description below and partially become apparent from the description below, or will be learned through the practice of the embodiments of the present disclosure.

BRIEF DESCRIPTION OF THE DRAWINGS

Various additional advantages and benefits will become apparent to those of ordinary skill in the art from a reading of the following detailed description of the preferred embodiments. The drawings are only for the purpose of illustrating the preferred embodiments and are not to be considered limiting of the present disclosure. Moreover, throughout the drawings, the same reference numerals are used to denote the same parts. In the accompanying drawings:

FIG. 7 is a flow chart showing a manufacturing method of a solar cell in an embodiment of the present disclosure.

Figure 1:
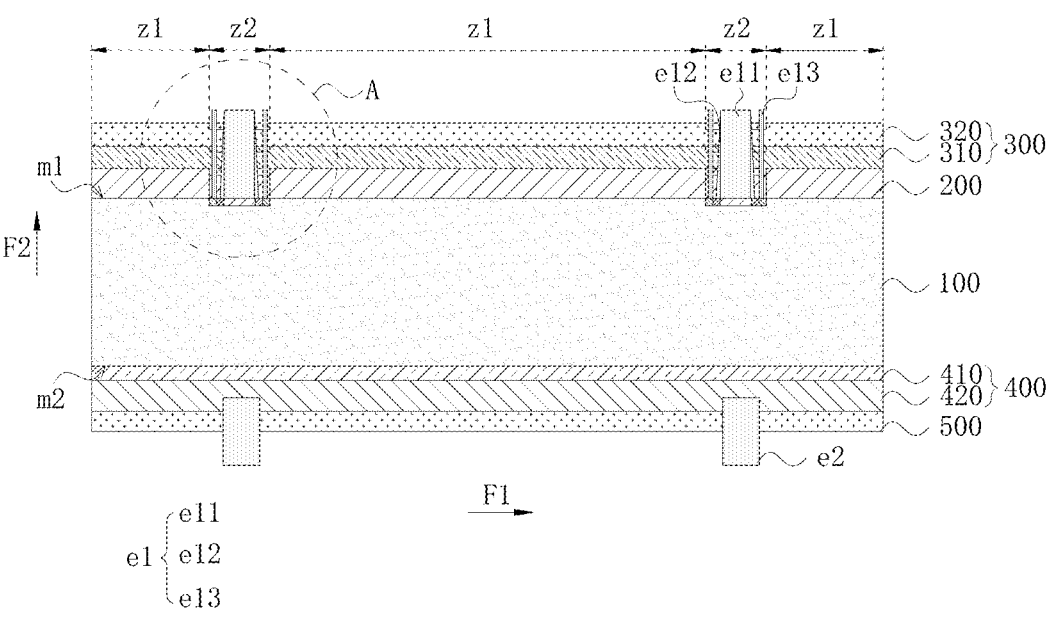
FIG. 1 is a schematic diagram showing a structure of a solar cell in an embodiment of the present disclosure.

DESCRIPTION OF REFERENCE NUMERALS substrate 100, first surface m1, second surface m2;
doped layer 200, lightly doped region z1, heavily doped region z2, body region z21, fourth projection y4, connecting region z22, fifth projection y5, edge region z23, sixth projection y6;
first passivation film layer 300, first passivation layer 310, first anti-reflection layer 320;
passivated contact layer 400, tunnel oxide layer 410, doped polysilicon layer 420;
second passivation film layer 500;
first electrode e1, electrode body e11, first projection y1, connecting electrode e12, second projection y2, edge electrode e13, third projection y3, second electrode e2;
first direction F1, second direction F2, third direction F3;
steps S110, S120, S130, S140.

DETAILED DESCRIPTION OF THE EMBODIMENTS

In order to make the above objectives, features and advantages of the present disclosure more obvious and understandable, specific implementations of the present disclosure are described in detail below with reference to the accompanying drawings. In the following description, many specific details are set forth in order to fully understand the present disclosure. However, the present disclosure can be implemented in many other ways different from those described herein, and those skilled in the art can make similar improvements without departing from the connotation of the present disclosure. Therefore, the present disclosure is not limited by the specific embodiments disclosed below.

In the description of the present disclosure, it should be understood that if the terms "center", "longitudinal", "transverse", "length", "width", "thickness", "upper", "lower", "front", "back", "left", "right", "vertical", "horizontal", "top", "bottom", "inner", "outer", "clockwise", "counter-clockwise", "axial", "radial", "circumferential", etc. appear, the orientation or position relationship indicated by these terms is based on the orientation or position relationship shown in the accompanying drawings and are merely intended to facilitate the description of the present disclosure and simplify the description, rather than indicating or implying that the indicated device or element must have a particular orientation or be constructed and operated in a particular orientation, and therefore are not to be interpreted as limiting the present disclosure.

In addition, if the terms "first" and "second" appear, these terms are used for descriptive purposes only, and cannot be interpreted as indicating or implying relative importance or implicitly specifying the quantity of indicated technical features. Thus, the features defined as "first" and "second" may explicitly or implicitly include at least one of these features. In the description of the present disclosure, if the term "plurality" appears, "plurality" means at least two, such as two, three, etc., unless otherwise clearly and specifically defined.

In the present disclosure, unless otherwise clearly specified and limited, if the terms "mounted", "connected", "connection", "fixation" and other terms appear, these terms should be understood in a broad sense, for example, it may be a fixed connection or a detachable connection, or an integrated connection; it may be a mechanical connection or an electrical connection; it may be a direct connection or an indirect connection through an intermediate medium, and it may be an internal connection between two elements or an interaction relationship between the two elements, unless otherwise clearly defined. It is worth noting that, in the following description and the appended claims, "electrically connected" between one feature and another feature not only includes one feature being in direct contact with another feature to form an electric energy transmission or current transmission channel, but also includes the one feature, the another feature and the intermediate features therebetween forming an electric energy transmission channel or a current transmission channel to achieve electric energy transmission or delivery. Those of ordinary skill in the art can understand the specific meanings of the above terms in the present disclosure according to specific situations.

In the present disclosure, unless otherwise clearly specified and limited, if there is a description that a first feature is "above" or "under" a second feature, etc., or similar description, it may mean that the first and second features are in direct contact, or the first and second features are in indirect contact through an intermediate medium. Moreover, the first feature being "on top of", "above" and "over" the second feature may mean that the first feature is directly above or obliquely above the second feature, or simply means that the horizontal height of the first feature is greater than the second feature. The first feature being "under", "beneath" and "below" the second feature may mean that the first feature is directly below or obliquely below the second feature, or simply means that the horizontal height of the first feature is less than the second feature.

It should be noted that when an element is referred to as being "fixed on" or "disposed on" another element, it may be directly on the other element or there may be an intervening element. When the element is referred to as being "connected to" another element, it may be directly connected to the other element or intervening elements may also be present. If present, the terms "vertical", "horizontal", "upper", "lower", "left", "right" and similar expressions used in this disclosure are for the purpose of illustration only and are not meant to be the only embodiments.

Figure 2:
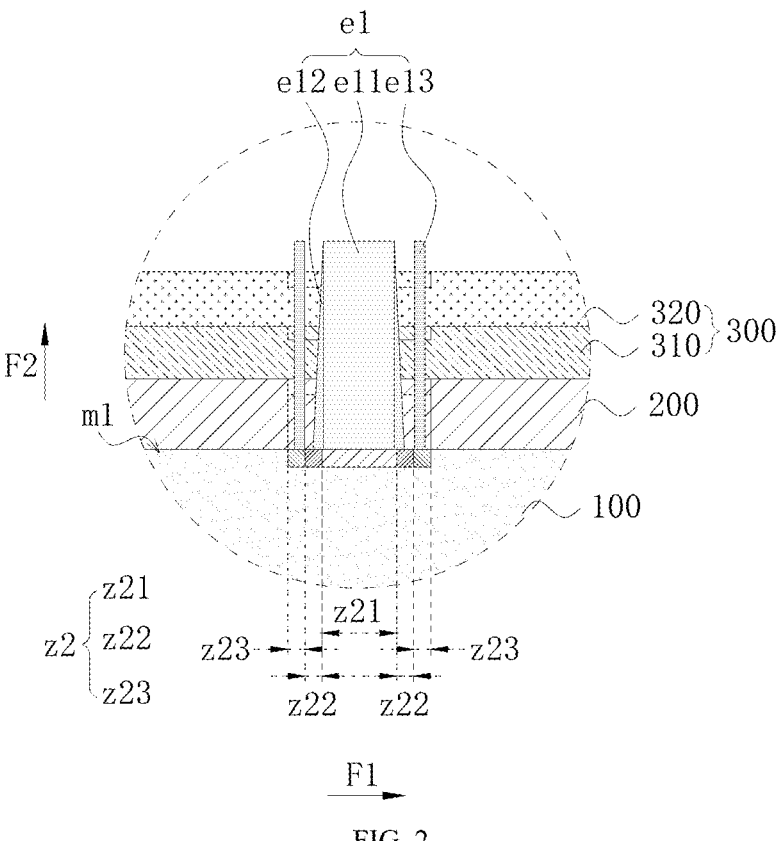
FIG. 2 is a schematic diagram showing a local enlarged structure at A in FIG. 1.
Figure 3:
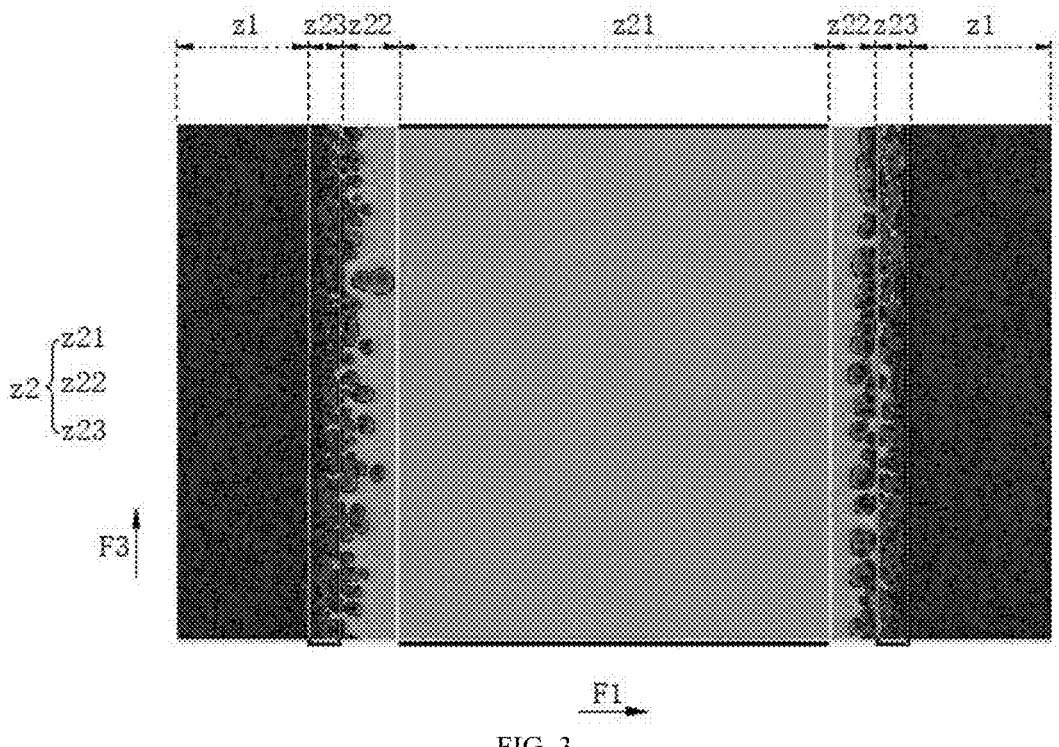
FIG. 3 is an electron microscope image showing each region of a doped layer in an embodiment of the present disclosure.

FIG. 1 is a schematic diagram showing a structure of a solar cell in an embodiment of the present disclosure. FIG. 2 is a schematic diagram showing a local enlarged structure at A in FIG. 1. FIG. 3 is an electron microscope image showing each region of a doped layer in an embodiment of the present disclosure. For purposes of illustration, only those relevant to embodiments of the present disclosure are shown.

Referring to FIGS. 1 and 2, an embodiment of the present disclosure provides a solar cell, including a substrate 100, a doped layer 200, and a first electrode e1.

For ease of illustration, the directions involved in the embodiments of the present disclosure are first illustrated exemplarily. A first direction F1 is a direction of a width of the first electrode e1, and is also a direction of a width of a heavily doped region z2 of the doped layer 200 as illustrated below, i.e., the direction of the width of each region in the heavily doped region z2 of the doped layer 200. A second direction F2 is a direction of thickness of the solar cell, i.e., a direction of thickness of the substrate 100, a direction of thickness of the doped layer 200 and a direction of thickness of the first electrode e2 are all the second direction F2. A direction of thickness of each of the other layers in the solar cell illustrated below is also the second direction F2. A third direction F3 is a longitudinal extension direction of the first electrode e1, and is also a longitudinal extension direction of the heavily doped region z2 of the doped layer 200 illustrated below, and is a longitudinal extension direction of each region in the heavily doped region z2 of the doped layer 200. The first direction F1, the second direction F2, and the third direction F3 can be perpendicular to each other.

It should be noted that, in other embodiments, the longitudinal extension direction of the first electrode e1, the longitudinal extension direction of the heavily doped region z2 of the doped layer 200, and the longitudinal extension direction of each region in the heavily doped region z2 of the doped layer 200 may be substantially the same direction.

The substrate 100 is configured to receive incident light and generate photogenerated carriers. Exemplarily, the solar cell may be a Tunnel Oxide Passivated Contact (TOPCon) cell. The substrate 100 can be selected according to actual needs. For example, the substrate 100 may be a silicon substrate. The doping type of the substrate 100 is not particularly limited. For example, the substrate 100 may be an N-type doped silicon substrate, or may be a P-type doped silicon substrate. In the embodiments of the present disclosure, this is not specifically limited. In the embodiments of the present disclosure, the substrate 100 may be an N-type monocrystalline silicon wafer.

The substrate 100 has a first surface m1. The substrate 100 further has a second surface m2 opposite to the first surface m1. The first surface m1 and the second surface m2 are disposed opposite to each other along the second direction F2. Both the first surface m1 and the second surface m2 can be configured to receive the incident light. In the embodiments of the present disclosure, the first surface m1 is a light-receiving surface, and the second surface m2 is a backlight surface. It can be understood that the light-receiving surface and the backlight surface are relative. The light-receiving surface is specifically the surface on the substrate 100 in the solar cell or in the photovoltaic module that is mainly irradiated by sunlight. With the development of solar cell technology, the backlight surface also receives energy from the sunlight, mainly from reflected light or scattered light in the surrounding environment. The first surface m1 is generally provided with a textured structure, which can increase a light absorption area, increase a photocurrent, and help improve the efficiency of the solar cell.

The doped layer 200 is disposed on the first surface m1 of the substrate 100. The doped layer 200 is configured to form a PN junction with the substrate 100. The doped layer 200 may be an N-type doped semiconductor layer, or a P-type doped semiconductor layer. In the embodiments of the present disclosure, the doped layer 200 is a P-type doped semiconductor layer, which may be one of a P-type amorphous silicon layer, a P-type microcrystalline silicon layer or a P-type nanocrystalline silicon layer. The type of the doped layer can be flexibly set according to specific usage situations, which is not specifically limited thereto in the embodiments of the present disclosure.

The doped layer 200 includes a lightly doped region z1 and a heavily doped region z2. Referring to FIG. 3, the heavily doped region z2 includes a body region z21, edge regions z23 located at both sides of the body region z21 along the first direction F1, and connecting regions z22 located between the edge regions z23 and the body region z21. In other words, both sides of the body region z21 along the first direction F1 are each connected to a connecting region z22 respectively, and a side of each of the connecting regions z22 that is away from the body region z21 connected to this connecting region z22 is connected to an edge region z23. A doping concentration of the body region z21, a doping concentration of each of the connecting regions z22, a doping concentration of each of the edge regions z23, and a doping concentration of the lightly doped region z1 decrease sequentially.

It can be understood that the lightly doped region z1 and the heavily doped region z2 are relative. According to the concentration of a doping element in the doped semiconductor, the doping of the semiconductor can be divided into light doping and heavy doping, and the corresponding doped semiconductors are divided into a lightly doped semiconductor and a heavily doped semiconductor. The light doping indicates a lower doping concentration than that of the heavy doping, and in the described examples, the qualitative indication of the doping concentration is relative. The specific quantitative doping concentration associated with the qualitative doping concentration may change based on the specific implementations. For example, light doping a P-type doping element in the doped layer 200 may be represented as P+ type doping, and a P+ type semiconductor is obtained. Correspondingly, heavy doping the P-type doping element in the doped layer 200 may be represented as P++ type doping, and a P++ type semiconductor is obtained. The number of holes generated by the P++ type doping is greater than the number of holes generated by the P+ type doping.

In the embodiments of the present disclosure, for the same heavily doped region z2, the positional relationship between the body region z21, the connecting regions z22 and the edge regions z23 is relative. With reference to FIG. 3, for illustrative purposes, the corresponding regions are framed in FIG. 3, the edge regions z23 are located at the edges of the heavily doped region z2, the body region z21 is approximately located at the middle of the heavily doped region z2, and the connecting regions z22 are correspondingly located between the body region z21 and the edge regions z23 of the heavily doped region z2. The doping concentration of the body region z21, the doping concentration of each of the connecting regions z22, and the doping concentration of each of the edge regions z23 decrease sequentially, i.e., the doping concentration of the heavily doped region z2 is variable, and the doping concentration decreases sequentially from the middle to the edges on both sides of the heavily doped region z2. However, relative to the lightly doped region z1, the minimum doping concentration of the heavily doped region z2 is greater than the doping concentration of the lightly doped region z1.

The first electrode e1 is disposed on a side of the first surface m1 of the substrate 100. In a case that the first surface m1 is the light-receiving surface, the first electrode e1 is a front electrode. The first electrode e1 includes an electrode body e11, edge electrodes e13 located at both sides of the electrode body e11 along the first direction F1, and connecting electrodes e12 located between the electrode body e11 and the edge electrodes e13. In other words, both sides of the electrode body e11 along the first direction F1 are each connected to a connecting electrode e12 respectively, and an edge electrode e13 is disposed on a side of each of the connecting electrodes e12 that is away from the electrode body e11 connected with this connecting electrode e12.

It should be noted that the first electrode e1 can be manufactured by screen printing and sintering. During actual process of printing the first electrode e1, there are offset portions and sputtering separation portions of the first electrode e1 to varying degrees. The first electrode e1 can be roughly divided into the electrode body e11, the connecting electrodes e12, and the edge electrodes e13 as above.

For one same first electrode e1, the positional relationship between the electrode body e11, the connecting electrodes e12 and the edge electrodes e13 is relative. The edge electrodes e13 are located at the edges of the first electrode e1, the electrode body e11 is approximately located at the middle of the first electrode e1, and the connecting electrodes e12 are correspondingly located between the electrode body e11 and the edge electrodes e13 of the first electrode e1. The connecting electrodes e12 are connected to the corresponding electrode body e11, and may or may not be connected with corresponding edge electrodes e13.

An orthographic projection of the first electrode e1 on the substrate 100 is located within a range of an orthographic projection of the heavily doped region z2 of the doped layer 200 on the substrate 100, and the first electrode e1 forms an ohmic contact with the heavily doped region z2.

Specifically, an orthographic projection of the electrode body e11 on the substrate 100 is located within a range of an orthographic projection of the body region z21 of the doped layer 200 on the substrate 100. Orthographic projections of the edge electrodes e13 on the substrate 100 and orthographic projections of the connecting electrodes e12 on the substrate 100 are each located within the range of the orthographic projection of the heavily doped region z2 of the doped layer 200 on the substrate 100, and the orthographic projections of the connecting electrodes e12 on the substrate 100 are not located within a range of orthographic projections of the edge regions z23 of the doped layer 200 on the substrate 100.

It should be noted that the electrode body e11 of the first electrode e1 is manufactured corresponding to the body region z21 of the heavily doped region z2. The orthographic projections of the connecting electrodes e12 of the first electrode e1 on the substrate 100 may be located within the range of the orthographic projection of the body region z21 of the heavily doped region z2 on the substrate 100. The orthographic projections of the connecting electrodes e12 of the first electrode e1 on the substrate 100 may also be located within the range of the orthographic projections of the connecting regions z22 of the heavily doped region z2 on the substrate 100. A part of each of the orthographic projections of the connecting electrodes e12 of the first electrode e1 on the substrate 100 may be located within the range of the orthographic projection of the body region z21 of the heavily doped region z2 on the substrate 100, and the other part thereof may be located within the range of the orthographic projections of the connecting regions z22 of the heavily doped region z2 on the substrate 100. The orthographic projections of the edge electrodes e13 of the first electrode e1 on the substrate 100 may be located within the range of the orthographic projection of the body region z21 of the heavily doped region z2 on the substrate 100, within the range of the orthographic projections of the connecting regions z22 of the heavily doped region z2 on the substrate 100, or within the range of the orthographic projections of the edge regions z23 of the heavily doped region z2 on the substrate 100. A part of each of the orthographic projections of the edge electrodes e13 of the first electrode e1 on the substrate 100 may be located within the range of the orthographic projection of the body region z21 of the heavily doped region z2 on the substrate 100, and the other part thereof is located within the range of the orthographic projections of the connecting regions z22 of the heavily doped region z2 on the substrate 100. Alternatively, a part of each of the orthographic projections of the edge electrodes e13 of the first electrode e1 on the substrate 100 is located within the range of the orthographic projections of the connecting regions z22 of the heavily doped region z2 on the substrate 100, and the other part thereof is located within the range of the orthographic projections of the edge regions z23 of the heavily doped region z2 on the substrate 100.

Figure 4:
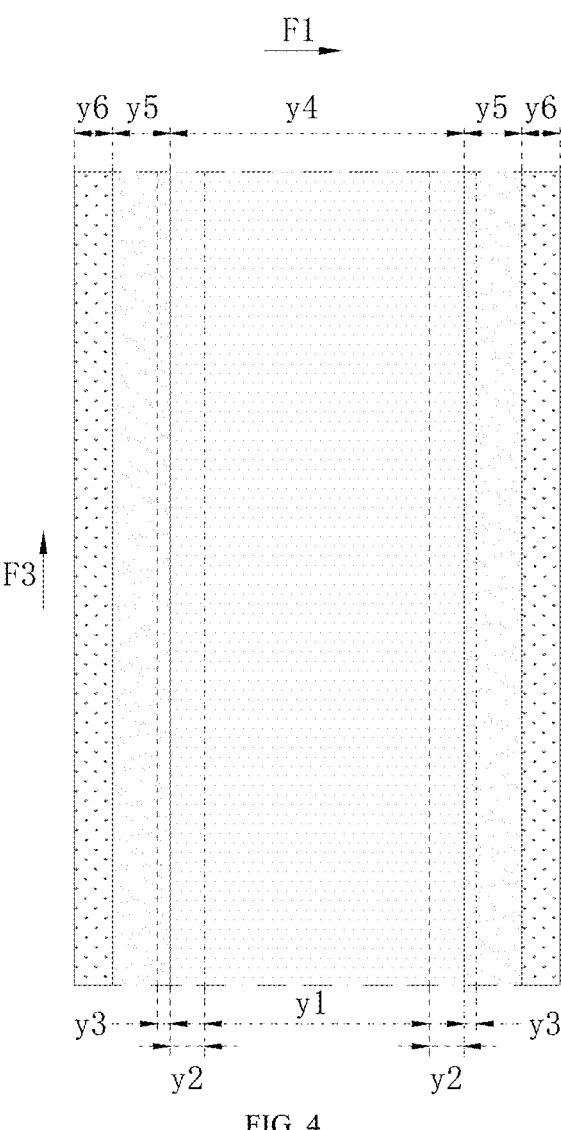
FIG. 4 is a schematic diagram showing an orthographic projection of a first electrode on a substrate and an orthographic projection of a heavily doped region of a doped layer on the substrate in an embodiment of the present disclosure.
Figure 5:
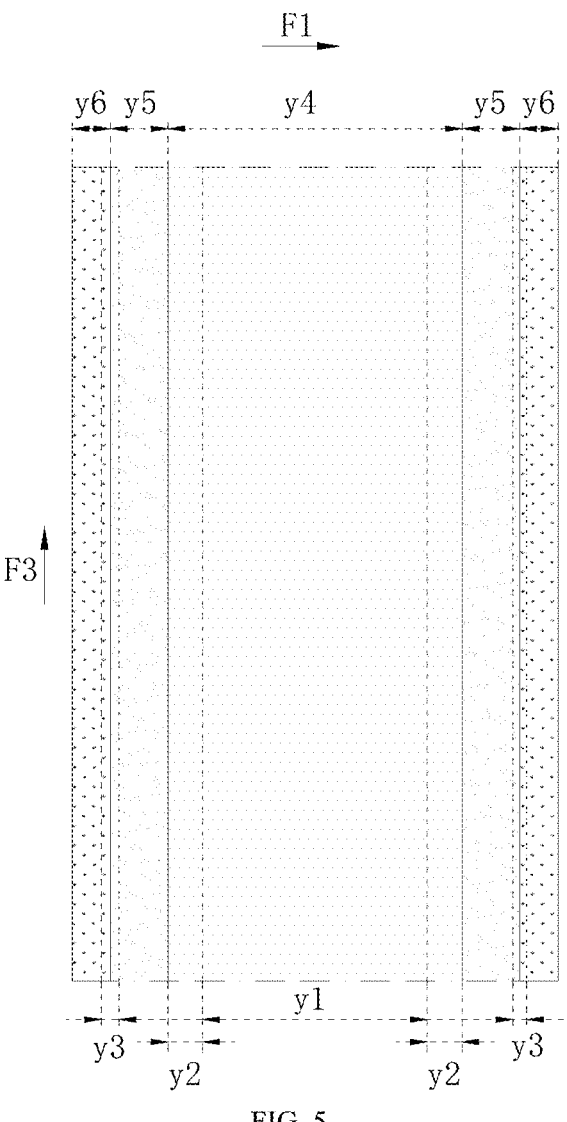
FIG. 5 is a schematic diagram showing an orthographic projection of a first electrode on a substrate and an orthographic projection of a heavily doped region of a doped layer on the substrate in another embodiment of the present disclosure.
Figure 6:
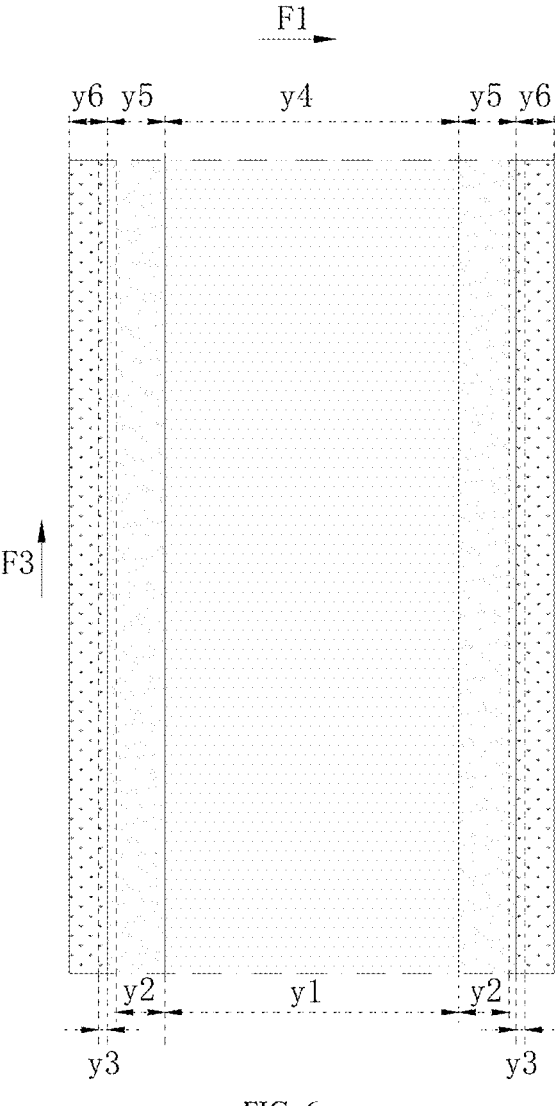
FIG. 6 is a schematic diagram showing an orthographic projection of a first electrode on a substrate and an orthographic projection of a heavily doped region of a doped layer on the substrate in yet another embodiment of the present disclosure.

FIG. 4 is a schematic diagram showing an orthographic projection of the first electrode e1 on the substrate 100 and an orthographic projection of the heavily doped region z2 of the doped layer 200 on the substrate 100 in an embodiment of the present disclosure. FIG. 5 is a schematic diagram showing an orthographic projection of the first electrode e1 on the substrate 100 and an orthographic projection of the heavily doped region z2 of the doped layer 200 on the substrate 100 in another embodiment of the present disclosure. FIG. 6 is a schematic diagram showing an orthographic projection of the first electrode e1 on the substrate 100 and an orthographic projection of the heavily doped region z2 of the doped layer 200 on the substrate 100 in yet another embodiment of the present disclosure. For purposes of illustration, only those relevant to embodiments of the present disclosure are shown. Only some of the projections are shown in FIGS. 4-6, and only the relative positional relationships of the projections are illustrated, without limiting the shapes of the projections.

It is defined that the orthographic projection of the electrode body e11 of the first electrode e1 on the substrate 100 is a first projection y1, the orthographic projections of the connecting electrodes e12 on the substrate 100 are second projections y2, the orthographic projections of the edge electrodes e13 on the substrate 100 are third projections y3, the orthographic projection of the body region z21 of the doped layer 200 on the substrate 100 is a fourth projection y4, the orthographic projections of the connecting regions z22 on the substrate 100 are fifth projections y5, and the orthographic projections of the edge regions z23 on the substrate 100 are sixth projections y6.

Taking FIG. 4 as an example, it illustrates a situation where the first projection y1 and the second projections y2 are located within a range of the fourth projection y4, and the third projections y3 are located within a range of the fifth projections y5. Taking FIG. 5 as an example, it illustrates a situation where the first projection y1 and the second projections y2 are located within the range of the fourth projection y4, a part of each of the third projections y3 is located within the range of the fifth projections y5, and the other part thereof is located within a range of the sixth projections y6. Taking FIG. 6 as an example, it illustrates a situation where the first projection y1 is located within the range of the fourth projection y4, the second projections y2 are located within the range of the fifth projections y5, and the third projections y3 are located within the range of the sixth projections y6.

The size of each of the regions in the heavily doped region z2 can be set accordingly according to specific usage situations, which is not specifically limited thereto.

Therefore, by configuring the heavily doped region z2 as the body region z21, the connecting regions z22 and the edge regions z23, the connecting regions z22 and the edge regions z23 can provide more manufacturing spaces for the connecting electrodes e12 and the edge electrodes e13. Since the doping concentration of the body region z21, the doping concentration of each of the connecting regions z22, the doping concentration of each of the edge regions z23, and the doping concentration of the lightly doped region z1 decrease sequentially, the ohmic contact between a part of the electrode and the lightly doped region z1 can be improved, while reducing carrier recombination and improving the passivation on the surface of the substrate 100, thereby improving the open-circuit voltage of the solar cell, and improving the fill factor of the solar cell and the conversion efficiency of the solar cell.

In some embodiments, referring to FIG. 1 and FIG. 2, a junction depth of the body region z21, a junction depth of each of the connecting regions z22, a junction depth of each of the edge regions z23, and a junction depth of the lightly doped region z1 decrease sequentially. The junction depth refers to a depth of the doped layer 200 along the second direction F2, i.e., the distance from the surface of the doped layer 200 facing away from the substrate 100 to the interface between the doped layer 200 and the substrate 100. It should be noted that the positional relationship of the body region z21, the connecting regions z22, the edge regions z23 and the lightly doped region z1 illustrated in FIGS. 1 and 2 are only shown approximately.

It can be understood that the greater the junction depth of a corresponding region in the doped layer 200 is, the greater the contact area between this region and the substrate 100 is. When the junction depth of the body region z21, the junction depth of each of the connecting regions z22, the junction depth of each of the edge regions z23, and the junction depth of the lightly doped region z1 decrease sequentially, a contact resistance between the first electrode e1 and the substrate 100 can be reduced, thereby improving the conversion efficiency of the solar cell.

In some embodiments, referring to FIG. 1 and FIG. 2, a junction depth of the heavily doped region z2 is in a range of 1.0 μm to 2.6 μm, and the junction depth of the lightly doped region z1 is in a range of 0.6 μm to 1.6 μm. In other words, the junction depth of the body region z21, the junction depth of each of the connecting regions z22, and the junction depth of each of the edge regions z23 are in the range of 1.0 μm to 2.6 μm, and decrease sequentially. The junction depth of the lightly doped region z1 is smaller than the junction depth of each of the edge regions z23. For example, the junction depth of the body region z21, the junction depth of each of the connecting regions z22, the junction depth of each of the edge regions $z23$, and the junction depth of the lightly doped region $z1$ may be 2.6 μm, 2 μm, 1.5 μm, and 1 μm, respectively. It can be set according to usage situations, which is not specifically limited thereto.

In this way, by making the junction depth of each of the regions of the doped layer 200 be in a suitable range, the contact resistance between the first electrode e1 and the substrate 100 can be further reduced, thereby improving the conversion efficiency of the solar cell.

In some embodiments, referring to FIG. 1 and FIG. 2, a square resistance of the body region $z21$, a square resistance of each of the connecting regions $z22$, a square resistance of each of the edge regions $z23$, and a square resistance of the lightly doped region $z1$ increase sequentially. The square resistance is a reflection of the doping concentration. Higher square resistance means less doping and shallower junction depth, while lower square resistance means more doping, deeper junction depth and smaller contact resistance. In this way, by the sequentially increasing of the square resistance of the body region $z21$, the square resistance of each of the connecting regions $z22$, the square resistance of each of the edge regions $z23$, and the square resistance of the lightly doped region $z1$, the contact resistance between the first electrode e1 and the substrate 100 can be reduced, thereby improving the conversion efficiency of the solar cell.

In some embodiments, referring to FIG. 1 and FIG. 2, a square resistance of the heavily doped region $z2$ is in a range of 40 Ω/□ to 120 Ω/□, and the square resistance of the lightly doped region $z1$ is in a range of 160 Ω/□ to 300 Ω/□. In other words, the square resistance of the body region $z21$, the square resistance of each of the connecting regions $z22$, and the square resistance of each of the edge regions $z23$ are in the range of 1.0 μm to 2.6 μm, and increase sequentially. The square resistance of the lightly doped region $z1$ is greater than the square resistance of each of the edge regions $z23$. For example, the square resistance of the body region $z21$, the square resistance of each of the connecting regions $z22$, the square resistance of each of the edge regions $z23$, and the square resistance of the lightly doped region $z1$ may be 40 Ω/□, 80 Ω/□, 100 Ω/□ and 200 Ω/□, respectively.

In this way, by making the square resistance of each of the regions of the doped layer 200 be in a suitable range, the contact resistance between the first electrode e1 and the substrate 100 can be further reduced, thereby improving the conversion efficiency of the solar cell.

In some embodiments, referring to FIG. 1 and FIG. 2, a size of the body region $z21$, a size of each of the connecting regions $z22$, and a size of each of the edge regions $z23$ decrease sequentially along the first direction F1. These sizes correspond to widths. The widths of the connecting regions $z22$ located on both sides of the body region $z21$ along the first direction F1 can be the same or different, and the widths of the edge regions $z23$ located on both sides of the body region $z21$ along the first direction F1 can be the same or different. Exemplarily, the widths of the connecting regions $z22$ located on both sides of the body region $z21$ along the first direction F1 are the same or approximately the same, and the widths of the edge regions $z23$ located on both sides of the body region $z21$ along the first direction F1 are the same or approximately the same. Since the probability of the first electrode e1 shifting to both sides of the body region $z21$ along the first direction F1 is basically the same, a better manufacturing space can be provided for the first electrode e1 in a case of "same or approximately the same" described above.

In this way, the widths of the body region $z21$, the connecting regions $z22$ and the edge regions $z23$ can be set accordingly with reference to the width of the first electrode e1 and the structure of each part of the first electrode e1, which is beneficial to provide the required manufacturing spaces and further improve the contact resistance. Meanwhile, the carrier recombination is reduced, and the passivation of the surface of the substrate 100 is improved, thereby improving the open-circuit voltage of the solar cell, and improving the fill factor of the solar cell and the conversion efficiency of the solar cell.

In some embodiments, referring to FIG. 1 and FIG. 2, a size of the heavily doped region $z2$ along the first direction F1 is in a range of 20 μm to 120 μm. Exemplarily, the width of the heavily doped region $z2$ may be 20 μm, 50 μm, 70 μm, 85 μm, 100 μm or 120 μm. In this way, the width of the heavily doped region $z2$ can be flexibly set according to usage demands.

In some embodiments, referring to FIG. 1 and FIG. 2, the substrate 100 includes a P-type substrate, and the doped layer 200 is a phosphorus-doped layer. Alternatively, the substrate 100 includes an N-type substrate, and the doped layer 200 is a boron-doped layer. In other words, when the substrate 100 is the P-type substrate, phosphorus diffusion can be used to form the doped layer 200 as the phosphorus-doped layer. When the substrate 100 is the N-type substrate, boron diffusion can be used to form the doped layer 200 as the boron-doped layer. In the embodiments of the present disclosure, taking the substrate 100 as the N-type substrate as an example, in this case, the doped layer 200 may be a P-type doped layer, for example, a boron-doped layer (also called a P+ type emitter).

The required type of substrate 100 and the corresponding diffusion method can be selected according to actual usage situations, which is not specifically limited thereto.

In some embodiments, referring to FIG. 1, the solar cell further includes a first passivation film layer 300 stacked on a surface of the doped layer 200 facing away from the substrate 100. The first electrode e1 is disposed on a surface of the first passivation film layer 300 facing away from the doped layer 200, and forms an ohmic contact with the heavily doped region $z2$.

The first passivation film layer 300 plays a role in surface passivation and anti-reflection in the solar cell, can perform good chemical passivation on the dangling bonds on the surface of the substrate 100, and has an anti-reflection effect on the front side of the solar cell.

Exemplarily, taking FIG. 1 as an example, the first passivation film layer 300 includes a first passivation layer 310 and a first anti-reflection layer 320 that are sequentially stacked on the doped layer 200. The first passivation layer 310 may use a single-layer structure or a multi-layer structure, and the material of the passivation layer may be at least one of aluminum oxide, silicon oxide, silicon nitride or silicon oxynitride. In addition, the first passivation layer 310 may be formed by chemical deposition. The first anti-reflection layer 320 may use a multi-layer structure. In a multi-layered first anti-reflection layer 320, the material of each layer may be silicon oxide, silicon nitride or silicon oxynitride.

In some embodiments, referring to FIG. 1, the solar cell further includes a passivated contact layer 400 and a second passivation film layer 500 that are sequentially stacked on the second surface m2 of the substrate 100. For example, the passivated contact layer 400 may be directly stacked on the second surface m2 of the substrate 100, and the second passivation film layer 500 may be directly stacked on the passivated contact layer 400.

Exemplarily, the passivated contact layer 400 may include a tunnel oxide layer 410 and a doped polysilicon layer 420 that are sequentially stacked on the second surface m2 of the substrate 100. The tunnel oxide layer 410 is configured to achieve interface passivation of the second surface m2 of the substrate 100, providing a chemical passivation effect. Specifically, by saturating the dangling bonds on the surface of the substrate 100, the density of the interface defect states of the second surface m2 of the substrate 100 is reduced, thereby reducing the recombination centers of the second surface m2 of the substrate 100 to reduce the carrier recombination rate. The material of the tunnel oxide layer 410 may be a dielectric material, such as at least one of silicon oxide, magnesium fluoride, silicon oxide, amorphous silicon, polycrystalline silicon, silicon carbide, silicon nitride, silicon oxynitride, aluminum oxide, or titanium oxide.

The passivated contact layer 400 can reduce the recombination of carriers on the surface of the substrate 100, thereby increasing the open-circuit voltage of the solar cell and improving the photoelectric conversion efficiency of the solar cell.

The second passivation film layer 500 may also use a single-layer or multi-layer structure, and the material of the second passivation film layer 500 may be silicon oxide, silicon nitride, or silicon oxynitride. The second passivation film layer 500 includes at least one second anti-reflection layer (not shown) stacked on the passivated contact layer 400. In this way, the reflectivity of the second surface m2 of the substrate 100 to sunlight can be reduced, and the absorptivity of the second surface m2 of the substrate 100 to the sunlight can be increased. The second passivation film layer 500 also plays a role of passivation and anti-reflection.

In some embodiments, referring to FIG. 1, the solar cell further includes a second electrode e2 located at a side of the second passivation film layer 500 facing away from the passivated contact layer 400. The second electrode e2 is in an ohmic contact with the doped polysilicon layer 420.

It should be noted that in the embodiments of the present disclosure, a film layer stacked on another structural layer includes a case where the film layer is directly stacked on the other structural layer, or a case where the film layer is disposed on the another structural layer via other structural layers. The stacking is only used to limit the setting range of this film layer.

FIG. 7 is a flow chart showing a manufacturing method of a solar cell in an embodiment of the present disclosure. For purposes of illustration, only those relevant to embodiments of the present disclosure are shown.

Based on the same inventive concept, referring to FIG. 7, and with reference to FIG. 1 and FIG. 2, an embodiment of the present disclosure provides a manufacturing method of a solar cell, including the following steps:

In step S110, a substrate 100 is provided.

In step S120, a doped layer 200 is formed by performing a diffusion on a first surface m1 of the substrate 100.

In step S130, a target region of the doped layer 200 is doped to form a heavily doped region z2. The heavily doped region z2 includes a body region z21, edge regions z23 located at both sides of the body region z21 along a first direction F1, and connecting regions z22 located between the edge regions z23 and the body region z21. A region on the doped layer 200 other than the target region is a lightly doped region z1. A doping concentration of the body region z21, a doping concentration of each of the connecting regions z22, a doping concentration of each of the edge regions z23, and a doping concentration of the lightly doped region z1 decrease sequentially.

In step S140, a first electrode e1 is formed on a side of the first surface m1 of the substrate 100. An orthographic projection of the first electrode e1 on the substrate 100 is located within a range of an orthographic projection of the heavily doped region z2 of the doped layer 200 on the substrate 100, and forms an ohmic contact with the heavily doped region z2. The first electrode e1 includes an electrode body e11, edge electrodes e13 located at both sides of the electrode body e11 along the first direction F1, and connecting electrodes e12 located between the electrode body e11 and the edge electrodes e13. An orthographic projection of the electrode body e11 on the substrate 100 is located within a range of an orthographic projection of the body region z21 of the doped layer 200 on the substrate 100. Orthographic projections of the edge electrodes e13 on the substrate 100, and orthographic projections of the connecting electrodes e12 on the substrate 100 are each located within the range of the orthographic projection of the heavily doped region z2 of the doped layer 200 on the substrate 100, and the orthographic projections of the connecting electrodes e12 on the substrate 100 are not located within a range of orthographic projections of the edge regions z23 of the doped layer 200 on the substrate 100.

In step S110, the substrate 100 may be processed by a polishing process, a texturing process, and a cleaning process. The polishing process may be a chemical polishing process, or a physical polishing process. For example, the polishing process may be alkali polishing, and a solution of the alkali polishing may be an alkali solution such as KOH, NaOH or TMAH. The texturing process may be alkali texturing. For example, by using polishing and texturing additives, the substrate 100 can be cleaned of impurities and prepared with a pyramid texture surface at 20-80° C. The selection can be made according to the specific usage situations, which is not specifically limited in the embodiments of the present disclosure. A textured structure may be formed on the corresponding surface of the substrate 100 through the texturing process.

In step S120, a corresponding diffusion method may be selected according to the type of the substrate 100. Taking the substrate 100 as an N-type substrate as an example, high-temperature boron diffusion can be performed to obtain the doped layer 200. The diffusion method can be set according to the specific usage situations, which is not specifically limited in the embodiments of the present disclosure. Exemplarily, a boron source for the high-temperature boron diffusion can be boron bromide, or boron chloride, etc. The diffusion temperature is in a range of 900° C. to 1100° C., the light diffusion square resistance is in a range of $160\Omega/\square$ to $300\Omega/\square$, and the junction depth is in a range of 0.6 μm to 1.6 μm.

In step S130, the target region of the doped layer 200 may be doped by a laser doping process to form the heavily doped region z2. A desired heavily doped layer 200 is obtained by adjusting a laser power and a process time. For example, the laser power is in a range of 20 W to 150 W, a laser irradiation frequency is in a range of 20 kHz to 3000 kHz, and a laser scanning speed is in a range of 10 m/s to 50 m/s. For another example, the laser doping process may be a one-time laser doping process.

It can be understood that when the laser power is in the range of 20 W to 150 W, the laser irradiation frequency is in the range of 20 kHz to 3000 kHz, and the laser scanning speed is in the range of 10 m/s to 50 m/s, the coordination of the laser power, the laser irradiation frequency and the laser scanning speed is beneficial to obtaining the desired heavily doped region z2 only through the one-time laser doping process. In this process, a downward thermal diffusion from the center to the edges of a laser spot is formed by a one-time laser, thereby forming the heavily doped region in the central region of the laser spot, forming the connecting regions z22 in the edge regions z23 of the laser spot, and forming the edge regions z23 outside the edges of the laser through thermal sputtering. On this basis, the one-time laser doping process can further reduce damage to the substrate 100.

It should be noted that a size of the laser spot along the first direction F1 can be regarded as a width of the laser spot, which can be determined according to a desired width of the body region z21. Exemplarily, a ratio of the size of the laser spot to the size of the heavily doped region z2 along the first direction F1 is 1. For example, the size of the laser spot along the first direction F1 is in a range of 20 μm to 120 μm. The size of the laser spot may be 20 μm, 30 μm, 50 μm, 70 μm, 80 μm, 100 μm, or 120 μm.

In step S140, the first electrode e1 may be formed on a side of the first surface m1 of the substrate 100 by a screen printing and sintering process, a laser transfer process, an electroplating process, or other processes.

In the embodiments of the present disclosure, the first electrode e1 is manufactured by using the screen printing and sintering process. The first electrode e1 may be printed based on an alignment mark, so as to facilitate alignment of the first electrode e1 with the heavily doped region z2. The alignment mark can be set by a laser process. In this process, even if printing is shifted, the connecting regions z22 and the edge regions z23 can provide more printing spaces. The body electrode of the first electrode e1 is located in the body region z21, the connecting electrodes e12 may be located in the body region z21 or the connecting regions z22, and the edge electrodes e13 may be located in the body region z21, the connecting regions z22 or a separation region. The positional relationship between the first electrode e1 and the heavily doped region z2 may refer to the contents of some of the above-mentioned embodiments, which will not be described in detail here again. After the first electrode e1 is printed by the screen-printing process, the first electrode e1 is sintered by the sintering process. A sintering peak temperature may be in a range of 650° C. to 900° C.

After step S140, a second electrode e2 may be formed on a side of a second surface m2 of the substrate 100. The implementation of the second electrode e2 may refer to that of the first electrode e1, which will not be described in detail herein. The first electrode e1 and the second electrode e2 may be symmetrically disposed about the substrate 100.

It should be understood that the implementations and various parameter ranges of the substrate 100, the doped layer 200, and the first electrode e1 have been described in detail in some of the above-mentioned embodiments, which will not be described in detail here. Similarly, the advantages of the solar cell manufactured by the manufacturing method illustrated above can also be referred to the contents illustrated in some of the above-mentioned embodiments, which will not be described in detail here.

In some embodiments, referring to FIG. 7, after step S130 and before step S140, the following steps are further included.

Firstly, impurities generated during the doping process and other impurities are cleaned through a cleaning process. For example, the impurities generated during the doping process may be boron-silicate glass (BSG). This cleaning process is mainly used to remove the BSG, and also removes metal or other impurities adsorbed on the surface of the substrate 100 during the manufacturing process.

Then a tunnel oxide layer 410 and a doped polysilicon layer 420 are sequentially deposited on the second surface m2 of the substrate 100 to form a passivated contact layer 400. A thickness of the tunnel oxide layer 410 may be in a range of 1 nm to 3 nm. The method for preparing the doped polysilicon layer 420 on the tunnel oxide layer 410 may be to first deposit an intrinsic polysilicon layer using low pressure chemical vapor deposition (LPCVD) or plasma enhanced chemical vapor deposition (PECVD), and then diffuse and dope phosphorus. A thickness of the doped polysilicon layer 420 may be in a range of 20 nm to 220 nm, and a square resistance may be in a range of 30 Ω/□ to 90 Ω/□.

Then impurities generated during the preparation of the above-mentioned layers and other impurities are cleaned through a cleaning process. For example, the impurities generated when preparing the layers may be phosphorus-silicate glass (PSG). This cleaning process mainly removes the PSG on the second surface m2 and the polysilicon interfering with the first surface m1, and also removes the metal or other impurities adsorbed on the surface of the substrate 100 during the manufacturing process.

Further, a first passivation film layer 300 may be deposited on a surface of the doped layer 200 facing away from the substrate 100, and a second passivation film layer 500 may be deposited on a surface of the doped polysilicon layer 420 facing away from the tunnel oxide layer 410. The first passivation film layer 300 includes a first passivation layer 310 and a first anti-reflection layer 320 that are deposited sequentially. The second passivation film layer 500 includes a second anti-reflection layer. The first passivation layer 310 may be deposited by a plate-type or tube-type device, and a thickness of the first passivation layer 310 may be in a range of 2 nm to 20 nm. A thickness of the first anti-reflection layer 320 and a thickness of the second passivation film may both be in a range of 40 nm to 100 nm.

It should be noted that some of the steps or stages illustrated above are not necessarily performed at the same time, but may be performed at different times. The order in which these steps or stages are performed is not necessarily sequential, and these steps may be performed alternately or alternately with other steps or at least some of the steps or stages in other steps. The selection can be made according to the specific usage situations, which is not specifically limited thereto.

Taking the example of doping the target area of the doped layer 200 by the laser doping process to form the heavily doped region z2, the solar cell manufactured in the embodiment of the present application is illustrated exemplarily.

In an embodiment of the present disclosure, the parameters of the laser doping process are as follows: the laser power is 55 W, the laser irradiation frequency is 50 kHz, the laser scanning speed is 25 m/s, and the width of the laser spot is 80 μm. The square resistance of the body region is 80 Ω/□, the junction depth of the body region is 2 μm, and the width of the body region is 65 μm. The square resistance of each of the connecting regions is 90 Ω/□, the junction depth of each of the connecting regions is 1.9 μm, and the width of each of the connecting regions is 10 μm. The square resistance of each of the edge regions is 100 Ω/□, the junction depth of each of the edge regions is 1.8 μm, and the width of each of the edge regions is 5 μm. The conversion efficiency of the solar cell is 26%.

In a comparative example, the parameters of the laser doping process are as follows: the laser power is 100 W, the laser irradiation frequency is 120 kHz, the laser scanning speed is 30 m/s, and the width of the laser spot is 140 μm.

The square resistance of the body region is $100\Omega/\square$, the junction depth of the body region is 2.6 μm, and the width of the body region is 130 μm. The square resistance of each of the connecting regions and the square resistance of each of the edge regions are $120\ \Omega/\square$, the junction depths of each of the connecting regions and each of the edge regions are 2.2 μm, and the widths of each of the connecting regions and each of the edge regions are 10 μm. The conversion efficiency of the solar cell is 25.4%.

The other conditions in the above two sets of experimental data are the same. In this comparative example, since the widths of the connecting regions and the widths of the regions other than the connecting regions are not sufficiently compatible with the width of the first electrode, the open-circuit voltage and the fill factor are reduced, resulting in a reduction in the conversion efficiency of the solar cell.

Based on the same inventive concept, an embodiment of the present disclosure provides a photovoltaic module, including the solar cell in any of the above embodiments; or, including the solar cell manufactured by the manufacturing method of a solar cell in any of the above embodiments.

Furthermore, a plurality of solar cells may be provided, and the solar cells may be electrically connected in a form of a whole piece or multiple pieces to form a plurality of battery strings. The plurality of battery strings may be electrically connected in series and/or in parallel. The photovoltaic module may further include an encapsulation layer and a cover plate. The encapsulation layer is configured to cover a surface of the battery string, and the cover plate is configured to cover a surface of the encapsulation layer away from the battery string. Specifically, in some embodiments, the plurality of battery strings may be electrically connected via conductive tapes. The encapsulation layer covers a surface of the solar cell. For example, the encapsulation layer may be an organic encapsulation film such as an ethylene-vinyl acetate copolymer film, a polyethylene-octene co-elastic film or a polyethylene terephthalate film. The cover plate may be a glass cover plate, a plastic cover plate or other cover plate with light transmission function.

The advantages possessed by the solar cell in any of the above embodiments, or the advantages possessed by the solar cell manufactured by the manufacturing method of a solar cell in any of the above embodiments, are also possessed by the photovoltaic module, which will not be described in detail herein.

Based on the same inventive concept, an embodiment of the present disclosure provides a photovoltaic system, including the photovoltaic module of any of the above embodiments. The advantages of the above-mentioned photovoltaic module are also possessed by the photovoltaic system, which will not be described in detail here again.

It can be understood that the photovoltaic system can be applied in photovoltaic power stations, such as ground power stations, rooftop power stations, water power stations, etc., the photovoltaic system can also be applied to equipment or devices that utilize solar energy to generate electricity, such as user solar power supplies, solar street lights, solar cars, solar buildings, etc. It is understandable that the application scenarios of the photovoltaic system are not limited to this, i.e., the photovoltaic system can be applied to all fields that require the use of solar energy for power generation. Taking the photovoltaic power generation system network as an example, the photovoltaic system may include photovoltaic arrays, a combiner box and an inverter. The photovoltaic array may be an array combination of a plurality of photovoltaic modules. For example, the plurality of photovoltaic modules can form a plurality of photovoltaic arrays. The photovoltaic arrays are connected to the combiner box, which can combine the current generated by the photovoltaic arrays. The combined current flows through the inverter and is converted into an alternating current required by the mains grid, and then the alternating current is connected to the mains network to achieve solar power supply.

The technical features in the above embodiments may be combined arbitrarily. For concise description, not all possible combinations of the technical features in the above embodiments are described. However, provided that they do not conflict with each other, all combinations of the technical features are to be considered to be within the scope described in this specification.

The above-mentioned embodiments only describe several implementations of the present disclosure, and their description is specific and detailed, but should not be understood as a limitation on the patent scope of the present disclosure. It should be noted that, for a person of ordinary skill in the art may further make variations and improvements without departing from the conception of the present disclosure, and these all fall within the protection scope of the present disclosure. Therefore, the protection scope of the present disclosure should be subject to the appended claims.

What is claimed is:

1. A solar cell, comprising:

a substrate having a first surface;

a doped layer disposed on the first surface of the substrate; the doped layer comprising a lightly doped region and a heavily doped region, the heavily doped region comprising a body region, edge regions located at both sides of the body region along a first direction, and connecting regions located between the edge regions and the body region; and a first electrode disposed on a side of the first surface of the substrate; an orthographic projection of the first electrode on the substrate being located within a range of an orthographic projection of the heavily doped region of the doped layer on the substrate, and the first electrode forming an ohmic contact with the heavily doped region;

wherein the first electrode comprises an electrode body, edge electrodes located at both sides of the electrode body along the first direction, and connecting electrodes located between the electrode body and the edge electrodes; wherein the connecting electrodes are connected to the electrode body, and the connecting electrodes are spaced apart from corresponding edge electrodes;

wherein an orthographic projection of the electrode body on the substrate is located within a range of an orthographic projection of the body region of the heavily doped region on the substrate, orthographic projections of the edge electrodes on the substrate and orthographic projections of the connecting electrodes on the substrate are each located within the range of the orthographic projection of the heavily doped region of the doped layer on the substrate, the orthographic projections of the connecting electrodes on the substrate are not located within a range of orthographic projections of the edge regions of the heavily doped region on the substrate, and the orthographic projections of the connecting electrodes on the substrate are each located at least partially within a range of orthographic projections of the connecting regions of the heavily doped region of the doped layer on the substrate;

wherein a first doping concentration of the body region is higher than a second doping concentration of each of the connecting regions, the second doping concentration of each of the connecting regions is higher than a third doping concentration of each of the edge regions, and the third doping concentration of each of the edge regions is higher than a fourth doping concentration of the lightly doped region.

2. The solar cell according to claim 1, wherein a junction depth of the body region, a junction depth of each of the connecting regions, a junction depth of each of the edge regions, and a junction depth of the lightly doped region decrease sequentially.

3. The solar cell according to claim 2, wherein a junction depth of the heavily doped region is in a range of 1.0 μm to 2.6 μm, and the junction depth of the lightly doped region is in a range of 0.6 μm to 1.6 μm.

4. The solar cell according to claim 1, wherein a square resistance of the body region, a square resistance of each of the connecting regions, a square resistance of each of the edge regions, and a square resistance of the lightly doped region increase sequentially.

5. The solar cell according to claim 4, wherein a square resistance of the heavily doped region is in a range of 40Ω/□ to 120Ω/□, and the square resistance of the lightly doped region is in a range of 160Ω/□ to 300Ω/□.

6. The solar cell according to claim 1, wherein a size of the body region, a size of each of the connecting regions, and a size of each of the edge regions decrease sequentially along the first direction.

7. The solar cell according to claim 6, wherein a size of the heavily doped region along the first direction is in a range of 20 μm to 120 μm.

8. The solar cell according to claim 1, wherein the substrate comprises a P-type substrate, and the doped layer is a phosphorus-doped layer; or the substrate comprises an N-type substrate, and the doped layer is a boron-doped layer.

9. The solar cell according to claim 1, wherein the substrate further has a second surface opposite to the first surface, the first surface is a light-receiving surface, and the second surface is a backlight surface.

10. The solar cell according to claim 1, further comprising a passivation film layer stacked on a surface of the doped layer facing away from the substrate, wherein the passivation film layer comprises a first passivation layer and a first anti-reflection layer that are sequentially stacked on the doped layer.

11. The solar cell according to claim 1, further comprising a passivated contact layer and a passivation film layer that are sequentially stacked on a second surface of the substrate opposite to the first surface, wherein the passivated contact layer comprises a tunnel oxide layer and a doped polysilicon layer that are sequentially stacked on the second surface of the substrate.

12. The solar cell according to claim 11, further comprising a second electrode located at a side of the passivation film layer facing away from the passivated contact layer.

13. A photovoltaic module, comprising: the solar cell of claim 1.

14. A photovoltaic system, comprising the photovoltaic module of claim 13.

15. The solar cell according to claim 1, wherein the orthographic projections of the edge electrodes on the substrate are each located at least partially within the range of the orthographic projections of the connecting regions or the range of the orthographic projections of the edge regions of the heavily doped region of the doped layer on the substrate.

* * * * *